(12) United States Patent
Fukuda et al.

(10) Patent No.: US 6,784,529 B2
(45) Date of Patent: Aug. 31, 2004

(54) SEMICONDUCTOR DEVICE

(75) Inventors: Tatsuya Fukuda, Tokyo (JP); Tomokazu Otani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/329,342

(22) Filed: Dec. 27, 2002

(65) Prior Publication Data

US 2003/0127721 A1 Jul. 10, 2003

(30) Foreign Application Priority Data

Jan. 4, 2002 (JP) ........................................ 2002-000172

(51) Int. Cl.[7] ............................................. H01L 23/02
(52) U.S. Cl. ....................... 257/686; 257/685; 257/787; 257/723
(58) Field of Search ................................ 257/686, 685, 257/786, 723, 777

(56) References Cited

U.S. PATENT DOCUMENTS

| | | | | | |
|---|---|---|---|---|---|
| 5,394,303 | A | * | 2/1995 | Yamaji | 361/749 |
| 5,602,420 | A | * | 2/1997 | Ogata | 257/686 |
| 5,801,439 | A | * | 9/1998 | Fujisawa et al. | 257/686 |
| 5,818,107 | A | * | 10/1998 | Pierson et al. | 257/723 |
| 6,188,021 | B1 | * | 2/2001 | Tandy | 257/686 |
| 6,229,217 | B1 | * | 5/2001 | Fukui et al. | 257/777 |
| 6,340,846 | B1 | * | 1/2002 | LoBianco et al. | 257/783 |
| 6,353,263 | B1 | * | 3/2002 | Dotta et al. | 257/777 |
| 6,448,110 | B1 | * | 9/2002 | Chen et al. | 438/109 |
| 6,495,895 | B1 | * | 12/2002 | Peterson et al. | 257/686 |
| 6,607,937 | B1 | * | 8/2003 | Corisis | 438/108 |
| 2001/0000053 | A1 | * | 3/2001 | Suh et al. | 257/686 |
| 2002/0180022 | A1 | * | 12/2002 | Emoto | 257/686 |

FOREIGN PATENT DOCUMENTS

| | | | | | |
|---|---|---|---|---|---|
| JP | 59-96759 | * | 6/1984 | | 257/777 |
| JP | 3-32050 | * | 2/1991 | | 257/685 |
| JP | 3-173167 | * | 7/1991 | | 257/686 |
| JP | 4-116965 | * | 4/1992 | | 257/777 |
| JP | 5-47998 | * | 2/1993 | | 257/777 |
| JP | P2000-124395 A | | 4/2000 | | |

* cited by examiner

Primary Examiner—Jasmine Clark
(74) Attorney, Agent, or Firm—McDermott Will & Emery LLP

(57) ABSTRACT

A semiconductor device of the present invention includes the multi-stacked structure having the bottom semiconductor package with BGA or PGA terminals so that the total number of terminals of the semiconductor device can be increased without increasing the mounting area. In particular, the semiconductor device includes a first semiconductor package having an upper and lower surfaces. The first semiconductor package has a plurality of land terminals on the lower surface. The semiconductor device also includes a second semiconductor package having a planar configuration substantially the same as that of the first semiconductor package, which is provided on the upper surface of the first semiconductor package. The second semiconductor package has a plurality of lead terminals extending from a side surface of the second semiconductor package.

8 Claims, 3 Drawing Sheets

SEMICONDUCTOR DEVICE

BACKGROUND OF THE INVENTION

1) Technical Field of the Invention

The present invention relates to a semiconductor device, and in particular, relates to the semiconductor device of a package-stacked structure, having increased memory capacity without increasing a mounting area.

2) Description of Related Arts

As a digital equipment incorporating such a semiconductor device, for example, a semiconductor memory device become more compact and lighter, it has been demanded that the mounting area of the semiconductor device on the mother board is reduced and the memory capacity per unit memory area is increased. One solution for satisfying this demand was, for example, to utilize a semiconductor device having a Small Outline Package (SOP) illustrated in FIGS. 6 and 7.

Shown in FIGS. 6 and 7 are a side and top views, respectively, of the semiconductor device 500 of the package-stacked structure having two semiconductor packages, i.e., SOPs 510, 520. The SOPs 510, 520 have rectangular planar configurations and two pairs of side surfaces opposing to each other. Also, the SOPs 510, 520 include package bodies 511, 521 having a plurality of outer lead frames 512, 522 extending one and other pairs of side surfaces, respectively. The outer lead frames 522 of the SOP 520 are designed such that they are longer than the outer lead frames 512 of the SOP 510.

According to the semiconductor device 500 shown in FIG. 7, the SOP 520 is stacked on the SOP 510 while the outer lead frames 512, 522 extend to the different directions (with about 90 degrees phase difference) so that the memory capacity per unit mounting area can be increased.

However, in the semiconductor device 500, the outer lead frames 512, 522 can extend only to four directions, it is quite difficult to further increase the lead frames so as to realize high-density lead frames.

Further, in case where the semiconductor device has the package-stacked structure of three semiconductor packages, the outer lead frames of the top and bottom SOPs may adversely contact each other. To avoid the disadvantage, the outer lead frames of the top SOP must extend longer in lateral directions, which causes the mounting area of the semiconductor device increased.

SUMMARY OF THE INVENTION

One of the aspects according to the present invention can provide a semiconductor device having package-stacked structure which realizes higher dense lead frames, also provide a semiconductor device having package-stacked structure of three or more semiconductor packages without increasing the mounting area.

A first aspect of the present invention is to provide a semiconductor device including a first semiconductor package having upper and lower surfaces. The first semiconductor package has a plurality of land terminals on the lower surface. The semiconductor device also includes a second semiconductor package having a planar configuration substantially the same as that of the first semiconductor package, which is provided on the upper surface of the first semiconductor package. The second semiconductor package has a plurality of lead terminals extending from a side surface of the second semiconductor package.

A second aspect of the present invention is to provide a semiconductor device including a first semiconductor package having an upper and lower surfaces. The first semiconductor package has a plurality of land terminals on the lower surface. The semiconductor device also includes a second semiconductor package having a planar configuration substantially the same as that of the first semiconductor package, which is provided on the upper surface of the first semiconductor package. The second semiconductor package has a plurality of lead terminals extending from a side surface of the second semiconductor package. Each of the lead terminals extends on and along the lower surface of the first semiconductor package.

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper", and "lower") are conveniently used just for clarity, it should not be interpreted that those terminology limit the scope of the present invention.

Embodiment 1.

Figure 1:
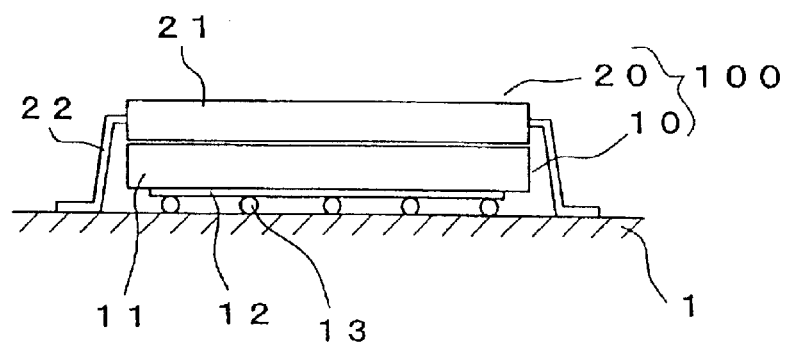
FIG. 1 is a side view of the semiconductor device of Embodiment 1 according to the present invention.

Referring to FIG. 1, a semiconductor device of Embodiment 1 of the present invention is illustrated with the reference numeral 100. The semiconductor device 100 includes a first and second semiconductor packages 10, 20 having a first and second package bodies 11, 21, respectively, with substantially the same planar configuration. The package bodies 11, 21 are made of plastics or ceramics, for example, and encompass semiconductor components such as a memory chip and processing unit.

The first semiconductor package 10 includes an insulating board 12 of material such as epoxy resin on the lower surface of the first package body 11, on which a plurality of land terminals (not shown in FIG. 1) are provided. The land terminals are electrically connected to the semiconductor component in the first package body 11. Provided on each of the land terminals are bump metals 13 made of metal such as solder and copper. Each of the bump metals 13 in conjunction with the corresponding land terminal is also referred to as a "ball grid array" (BGA) terminal. Also, the bump metals can be formed of any configurations such as a column and cone. In particular, a pin-like bump metal with the land, which is referred to as "pin grid array (PGA)" terminal, can replace with the BGA terminal.

The second semiconductor package 20 has two pairs of side surfaces opposing to each other, and a plurality of the lead frames (referred to also as lead terminals) 22 extend from one pair of side surfaces thereof. The lead terminals 22 are electrically connected to the semiconductor component in the second package body 21.

The first and second semiconductor packages 11, 21 are connected with the printed wired board 1 through the bump metals 13 and lead frames 32, respectively.

Also, the second semiconductor package 20 may have the lead frames 22 extending from both pairs of side surfaces (i.e., all four side surfaces) thereof.

The semiconductor device 100 including the first and second semiconductor packages 10, 20 with memory chips have greater memory capacity. Alternatively, the semiconductor device 100 can combine the first and second semiconductor packages 10, 20 with a memory chip and a processing unit, respectively, and vice versa.

The total terminals of the semiconductor device 100 can be increased in number with use of the bump metals 13 and the lead terminals 22. In particular, the second semiconductor package 20 can be provided with the lead terminals 22 extending from four side surfaces so that the semiconductor device 100 has terminals more than those of the conventional semiconductor device.

Also, because of no lead terminal on the side surface of the first semiconductor package 10, the possibility that the lead terminals of both semiconductor packages 10, 20 would contact each other can be eliminated, and the necessity that the lead terminals 22 of the second semiconductor package 20 are extended laterally beyond the lead terminals of the first semiconductor package 20 is not required. Therefore, the mounting area of the semiconductor device 100 can be substantially reduced.

Figure 2:
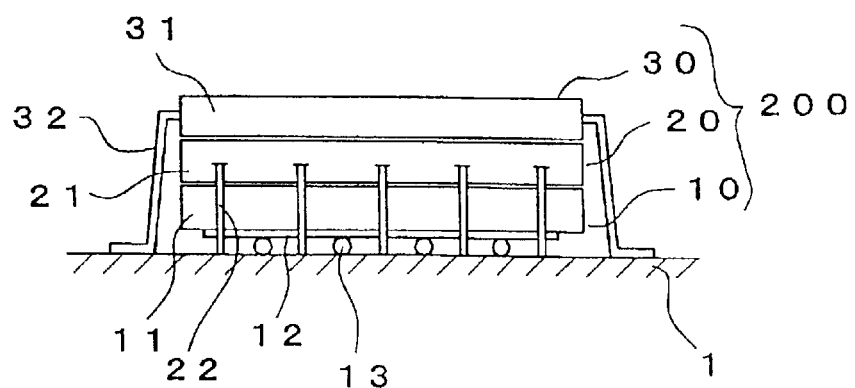
FIG. 2 is a side view of the alternative semiconductor device of Embodiment 1.

FIG. 2 shows a side view of an another semiconductor device of the present embodiment with the reference numeral 200. The semiconductor device 200 further includes a third semiconductor package 30 stacked on the semiconductor device 100 illustrated in FIG. 1. Since the first and second semiconductor packages 10, 20 have the same structures as described with reference of FIG. 1, no further description will be given thereto.

The third semiconductor package 30 has a third package body 31 with a planar configuration substantially the same as those of the first and second package bodies 11, 21. The third semiconductor package 30 also has two pairs of side surfaces opposing to each other, and a plurality of the lead frames (referred to also as lead terminals) 32 extend from one pair of side surfaces thereof. The lead frames 22, 32 of the second and third semiconductor package 20, 30 are designed so as to extend towards directions different from one another.

In the semiconductor device 200 so constructed, as the semiconductor device 100, the number of terminals can be increased without increasing the mounting area, and in addition, the memory capacity of the semiconductor device 200 can be enhanced by the tripartite structure.

Embodiment 2.

Figure 3:
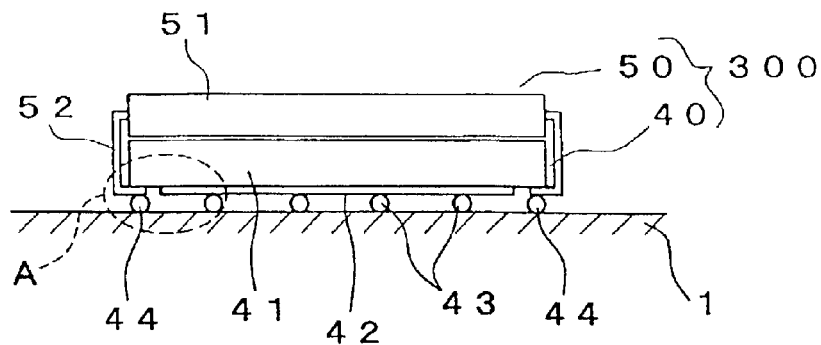
FIG. 3 is a side view of the semiconductor device of Embodiment 2 according to the present invention.

Referring to FIG. 3, a semiconductor device of Embodiment 2 of the present invention is illustrated with the reference numeral 300. The semiconductor device 300 includes a first and second semiconductor packages 40, 50 having a first and second package bodies 41, 51 with substantially the same planner configuration, respectively. The package bodies 41, 51 are made of plastics or ceramics, for example, and encompass semiconductor components such as a memory chip and processing unit.

The first semiconductor package 40 includes an insulating board 42 of material such as epoxy resin on the lower surface of the first package body 41, on which a plurality of land terminals (not shown in FIG. 3) are provided. The land terminals are electrically connected to the semiconductor component in the first package body 41. Provided on each of the land terminals are bump metals 43 made of metal such as solder and copper. Each of the bump metals 43 in conjunction with the corresponding land terminal compose a BGA terminal.

The second semiconductor package 50 has two pairs of side surfaces opposing to each other, and a plurality of the lead frames (referred to also as lead terminals) 52 extend from one pair of side surfaces thereof. The lead terminals 52 are electrically connected to the semiconductor component in the second package body 51.

The second semiconductor package 50 can be so-called a "Small Outline J-leaded Package (SOJ)", thus each of the lead frames 52 has a tip bent in a L-shaped configuration. Each of the lead frames 52 extending from the side surface of the second body 51 is bent downwardly so as to extend in parallel with the side surface of the first package body 41. Then, the tip of the lead frame 52 is bent inwardly so as to extend on and along the lower surface of the first package body 41. Also, the lead frame 52 may extend in contact with the side surface of the first package body 41.

Figure 4:
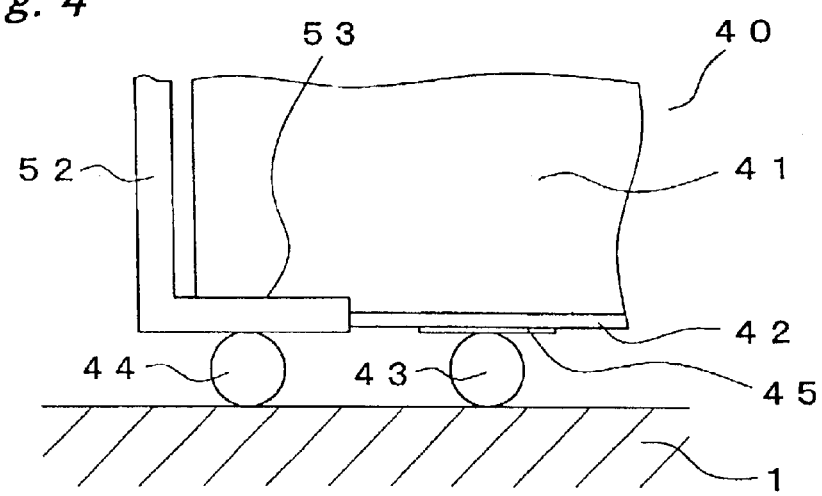
FIG. 4 is an enlarged view of the semiconductor device of Embodiment 2.

FIG. 4 is an enlarged view of a portion indicated by an imaginary line of FIG. 3. The first package body 41 includes a plurality of cut-off portions 53 at the positions corresponding to the lead frames 52 for receiving the L-shaped tips thereof. The depths of the cut-off portions 53 are designed so that the bottom surfaces of the lead frames 52 are substantially coplanar with those of the land terminals 45 on the insulating board 42.

As shown in FIG. 4, a plurality of bump metals 44 are provided on the bottom surfaces of the lead frames 52 received in the cut-off portions 53. The bump metals 44 on the lead frames 52 can be the same as those on the land terminals 45.

In the semiconductor device 300 so constructed, the lead frames 52 and the land terminals 45 have the bottom surfaces substantially coplanar with each other so that when connected with the printed wired board 1, the gaps to the lead frames 52 and the land terminals 45 from the printed wired board 1 are substantially the same as one another. Therefore, when the bump metals 43, 44 are heated to melt, a defective connection due to the deviation of the aforementioned gaps can be eliminated.

The total terminals of the semiconductor device 300 can be increased in number with use of the bump metals 43, 44 on the land terminals 45 and the lead terminals 52, respectively. Also, the second semiconductor package 50 can be provided with the lead terminals 52 extending from four side surfaces so that the semiconductor device 300 has terminals more than those of the conventional semiconductor device.

In addition, when the semiconductor device 300 is mounted on the printed wired board 1, the defective connection due to the deviation of the aforementioned gaps can be eliminated.

Figure 5:
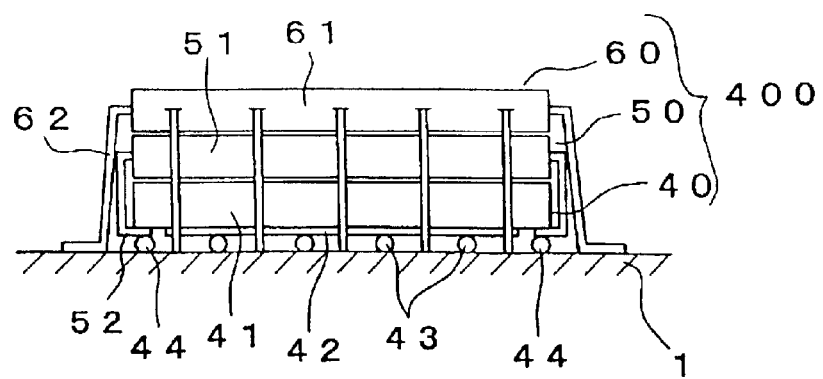
FIG. 5 is a side view of the alternative semiconductor device of Embodiment 2.
Figure 6:
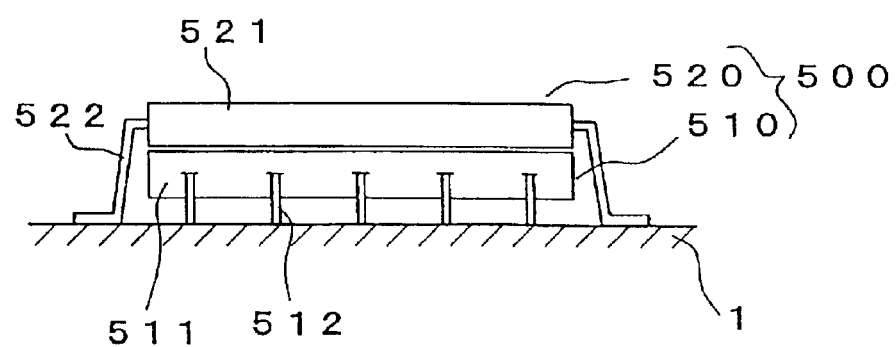
FIG. 6 is a side view of the semiconductor device of the prior art.
Figure 7:
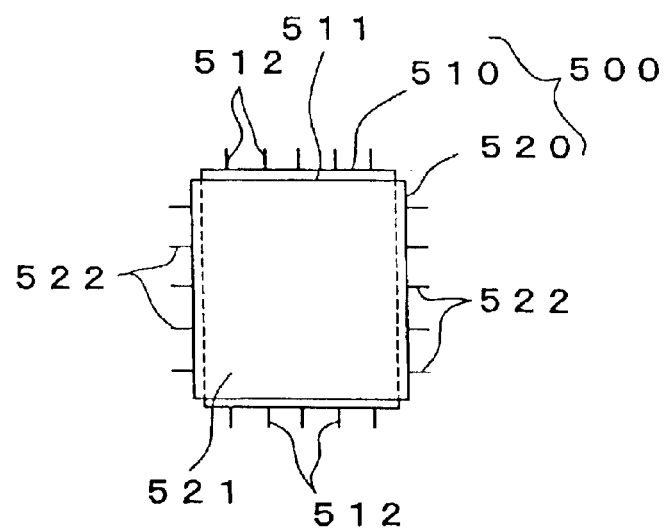
FIG. 7 is a top view of the semiconductor device of the prior art.

FIG. 5 shows a side view of an another semiconductor device of the present embodiment with the reference numeral 400. The semiconductor device 400 further includes a third semiconductor package 60 stacked on the semiconductor device 300 illustrated in FIG. 3. Since the first and second semiconductor packages 40, 50 have the same structures as described above in FIG. 3, no further description will be given thereto.

The third semiconductor package 60 has a third package body 61 with a planar configuration substantially the same as those of the first and second package bodies 41, 51. The third semiconductor package 60 also has two pairs of side surfaces opposing to each other, and a plurality of the lead frames 62 extend from at least one pair of side surfaces thereof.

In FIG. 5, although a plurality of the lead terminals 52 of the second semiconductor package 50 are shown to extend from one pair of the side surfaces, the lead terminals 52 may be provided on and extends from the another side surfaces. Also, although a plurality of the lead terminals 62 of the third semiconductor package 60 are shown to extend from four side surfaces, they may extend from only one pair (two) of the side surfaces. In case where the third semiconductor package 60 includes the lead terminals 62 extending from only one pair of the side surfaces, the semiconductor device 400 can include an another semiconductor package provided on the third semiconductor package 60.

In the semiconductor device 400 so constructed, as the semiconductor device 300, the number of terminals can be increased without increasing the mounting area, and in addition, the memory capacity of the semiconductor device 400 can further be enhanced by the multi-stacked structure such as the tripartite structure.

Since the lead terminals 52 of the second semiconductor package 50 are formed such that they extend in parallel and in close to the side surfaces of the first semiconductor package 40, the mounting area of the semiconductor device 400 is prevented from outwardly expanding, and no contact between the lead terminals 52, 62 of the second and third semiconductor packages 50, 60 is assured.

As described above, the semiconductor device of the present invention includes the multi-stacked structure having the bottom semiconductor package with BGA or PGA terminals so that the total number of terminals of the semiconductor device can be increased without increasing the mounting area. Also, the semiconductor device can achieve higher dense lead frames without expanding the mounting area.

What is claimed is:

1. A semiconductor device comprising:
a first semiconductor package having upper and lower surfaces, said first semiconductor package including a plurality of land terminals on the lower surface; and
a second semiconductor package having a planar configuration substantially the same as that of said first semiconductor package, provided on the upper surface of said first semiconductor package, said second semiconductor package including a plurality of lead terminals extending from a side surface of said second semiconductor package.

2. A semiconductor device comprising:
a first semiconductor package having upper and lower surfaces, said first semiconductor package including a plurality of land terminals on the lower surface;
a second semiconductor package having a planar configuration substantially the same as that of said first semiconductor package, provided on the upper surface of said first semiconductor package, said second semiconductor package including a plurality of lead terminals extending from a side surface of said second semiconductor package; and
a third semiconductor package having a planar configuration substantially the same as that of said second semiconductor package, provided on said second semiconductor package; and
said second and third semiconductor packages having two pairs of side surfaces opposing to each other,
wherein the plurality of the lead terminals of said second semiconductor package extend from one pair of the side surfaces, and said third semiconductor package includes a plurality of the lead terminals extending from the other pair of the side surfaces towards directions different from those of one pair of the side surfaces of said second semiconductor package.

3. The semiconductor device according to claim 1,
wherein said second semiconductor package has two pairs of side surfaces opposing to each other, and
wherein the plurality of the lead terminals of said second semiconductor package extend from at least one pair of side surfaces.

4. A semiconductor device comprising:
a first semiconductor package having an upper and lower surfaces, said first semiconductor package including a plurality of land terminals on the lower surface; and
a second semiconductor package having a planar configuration substantially the same as that of said first semiconductor package, provided on the upper surface of said first semiconductor package, said second semiconductor package including a plurality of lead terminals extending from a side surface of said second semiconductor package;
wherein each of the lead terminals extends on and along the lower surface of said first semiconductor package.

5. The semiconductor device according to claim 4,
wherein said first semiconductor package further includes a plurality of cut-off portions for receiving the lead terminals of the second semiconductor package, and
wherein the land terminals and the lead terminals have bottom surfaces coplanar with each other.

6. The semiconductor device according to claim 4,
wherein said second semiconductor package has two pairs of side surfaces opposing to each other, and
wherein the plurality of the lead terminals of said second semiconductor package extend from at least one pair of side surfaces.

7. The semiconductor device according to claim 4,
wherein each of the lead terminals is bent in a L-shaped configuration so as to extend on and along the lower surface of said first semiconductor package.

8. The semiconductor device according to claim 4, further comprising:
a third semiconductor package having a planar configuration substantially the same as that of said second semiconductor package, provided on said second semiconductor package;
wherein said third semiconductor packages include two pairs of side surfaces opposing to each other, and a plurality of lead terminals extending from at least one pair of side surfaces.

* * * * *